(12) United States Patent
Yanagisawa (10) Patent No.: US 6,828,603 B2
(45) Date of Patent: Dec. 7, 2004

(54) HETERO-BIPOLAR TRANSISTOR WITH A SUB-COLLECTOR LAYER HAVING A FIRST PORTION AND PLURAL SECOND PORTIONS

(75) Inventor: Masaki Yanagisawa, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/394,663

(22) Filed: Mar. 24, 2003

(65) Prior Publication Data

US 2003/0218184 A1 Nov. 27, 2003

(30) Foreign Application Priority Data

Mar. 27, 2002 (JP) ....................................... 2002-089587

(51) Int. Cl.[7] .......................................... H01L 31/0328
(52) U.S. Cl. ....................... 257/197; 257/198; 257/183; 257/189; 257/565; 257/586
(58) Field of Search ................................ 257/197, 198, 257/183, 189, 565, 586, 190, 191, 192, 194, 195, 280, 281, 589

(56) References Cited

U.S. PATENT DOCUMENTS

2002/0105011 A1    8/2002  Yaegashi et al.

Primary Examiner—Minhloan Tran
Assistant Examiner—Tan Tran
(74) Attorney, Agent, or Firm—Smith, Gambrell & Russell, LLP (57) ABSTRACT

A hetero-bipolar transistor according to the present invention enhances reliability that relates to the breaking of wiring metal. The transistor comprises a semiconductor substrate, a sub-collector layer formed on a (100) surface of the substrate, a collector mesa formed on the sub-collector layer, and an emitter contact layer. The transistor further includes a collector electrode and wiring metal connected to the collector electrode. The edge of the sub-collector layer forms a step S, the angle of which is in obtuse relative to the substrate. Therefore, the wiring metal traversing the step S bends in obtuse angle at the step S, thus reducing the breaking of the wiring metal.

6 Claims, 11 Drawing Sheets

HETERO-BIPOLAR TRANSISTOR WITH A SUB-COLLECTOR LAYER HAVING A FIRST PORTION AND PLURAL SECOND PORTIONS

BACKGROUND OF THE INVENTION

1. Field of the Invention

This invention relates to bipolar transistor (HBT) made of group III–V compound semiconductor materials and a method for manufacturing the HBT.

2. Related Prior Art

A hetero-junction bipolar transistor (HBT) is going to be used as an amplifying device for a transceiver in a high-speed and a high capacity optical communication because of a high current gain and an excellent high frequency performance inherently provided in the HBT. In the HBT, since an emitter layer has a band gap greater than that of a base layer, the emitter injection efficiency of electrons into the base region can be kept high even if the base layer is heavily doped, which results in a superior performance of the HBT at high frequency region.

However, various problems should be solved for the further improvement of the high frequency performance. One of the subjects to be solved is an intrinsic capacitance between the base and the emitter, which operates as a feedback capacitance, hence degrading the high frequency performance of the HBT. One structure for reducing the base-collector capacitance is that the HBT has a heavily doped sub-collector layer contacting to the collector layer, on the other hand, the collector layer is lightly doped. In the case that the HBT has the sub-collector layer, the collector electrode can be formed on the sub-collector layer, which enables to reduce not only the contact resistance of the collector electrode but the base-collector capacitance. Since a thickness of the sub-collector layer is set to be about 500 nm to reduce the collector resistance, a comparatively great step is formed at the edge of the sub-collector layer. A wiring metal to contact to the collector electrode must be formed so as to traverse such great step, which causes a breaking of the wiring metal.

Moreover, the HBT formed on an InP substrate, the sub-collector layer is typically made of InGaAs and formed by etching a semiconductor film epitaxially grown on the substrate with an etchant of a mixture of phosphoric acid, hydrogen peroxide and water. However, this etchant forms a side surface of InGaAs into a reverse trapezoid due to an inherent characteristic of the semiconductor. When the wiring metal traverses such side surface with an acute angle to the substrate, a possibility of breaking the wiring metal will increase.

SUMMARY OF THE INVENTION

One subject of the present invention is to provide a manufacturing method for reducing the occurrence of the breaking of the wiring metal traversing the great step formed at the edge of the sub-collector layer. Another subject of the present invention is to provide an HBT with an improved structure.

According to a method for producing an HBT of the present invention comprises the steps of: a) sequentially forming a sub-collector film and a series of semiconductor films on a semiconductor substrate, b) a forming a collector mesa made of the series of semiconductor films on the sub-collector film, c) forming a etching film for covering the collector mesa, and d) etching the sub-collector film by using the etching film as an etching mask. The collector mesa contains a collector layer, a base layer and an emitter layer, and a band gap energy of the emitter layer is greater than that of the base layer, thereby the collector, the base, the emitter functioning as an hetero-junction bipolar transistor. The etching film contains a first portion, a shape of which is substantially rectangle with a pair of sides extending along a [011] crystal direction, and a plurality of second portions. The respective second portions are demarcated by a plurality of sides, one side contacting to the side along the [011] direction of the first portion.

Since the second portions of the etching film has a plurality of sides, at least one of which extending along a direction normal to the [011] direction, side surfaces of the sub-collector layer formed after the etching has an obtuse angle relative to the substrate, even that the etching is performed by an etchant of a mixture of phosphoric acid and hydrogen peroxide. This reduces the breaking of the wiring metal traversing the side along the [011] direction of the sub-collector layer.

The second portions are preferably rectangle, one side of which contacts to the side extending along the [011] direction of the first portion of the etching film, and at least one side of other sides of the second portion extends along a direction across to the [011] direction. The side surfaces contained in such direction across to the [011] direction have an obtuse angle relative to the substrate. Another aspect of the present invention, the second portions of the etching film are preferably trapezoid, a longer side of pair of sides parallel to each other of the trapezoid contacting to the side extending along to the [011] direction of the first portion. Further, the trapezoid of the second portions is preferable to contact to adjoining trapezoid.

The HBT according to the present invention preferably comprises a semiconductor substrate, a sub-collector layer provided on the substrate and a collector mesa provided on the sub-collector layer. The collector mesa contains a collector layer, a base layer and an emitter layer with band gap energy greater than that of the base layer. These layers, from the substrate to the emitter layer, are made of group III–V compound semiconductor materials. The sub-collector layer contains a first portion of substantially rectangle with one of four sides extending along the [011] direction and a plurality of second portions. The respective second portions contacts to the one side extending along the [011] direction of the first portion and protrudes therefrom along the substrate. Since one of side surfaces of the respective second portions has an obtuse angle relative to the substrate, the wiring metal traversing not only the side along the [011] direction of the first portion but the second portions is prevented from the breaking, hence enhancing the reliability of the HBT even that the HBT has the sub-collector layer.

The HBT according to the present invention, the substrate is preferably InP, the sub-collector layer, the collector layer, the base layer are preferably InGaAs lattice matched to InP, and the emitter layer is preferably InP. Further, the emitter layer of the present invention is preferably InAlAs or InGaAsP instead of InP.

BRIEF DESCRIPTION OF THE DRAWINGS

FIGS. from 3A to 3C, from 4A to 4C, from 5A to 5C, and from 6A to 6C show sectional views of the HBT at respective process steps according to the second embodiment.

FIGS. from 8A to 8C and from 9A to 9C show sectional views of the HBT to illustrate the process for the wiring metal formation.

DETAILED DESCRIPTION OF THE EMBODIMENTS

Preferred embodiment of the present invention will be described in detail hereinbelow together with the drawings. In embodiments, an HBT formed on an InP substrate is described. Elements identical to each other will be referred to with numerals identical to each other without overlapping explanations. In the drawings, dimensions such as layer thickness will not always reflect their explanation. Indices of surface and axis appearing in the drawings are exemplary and would contain their equivalent.

(First Embodiment)

Figure 1:
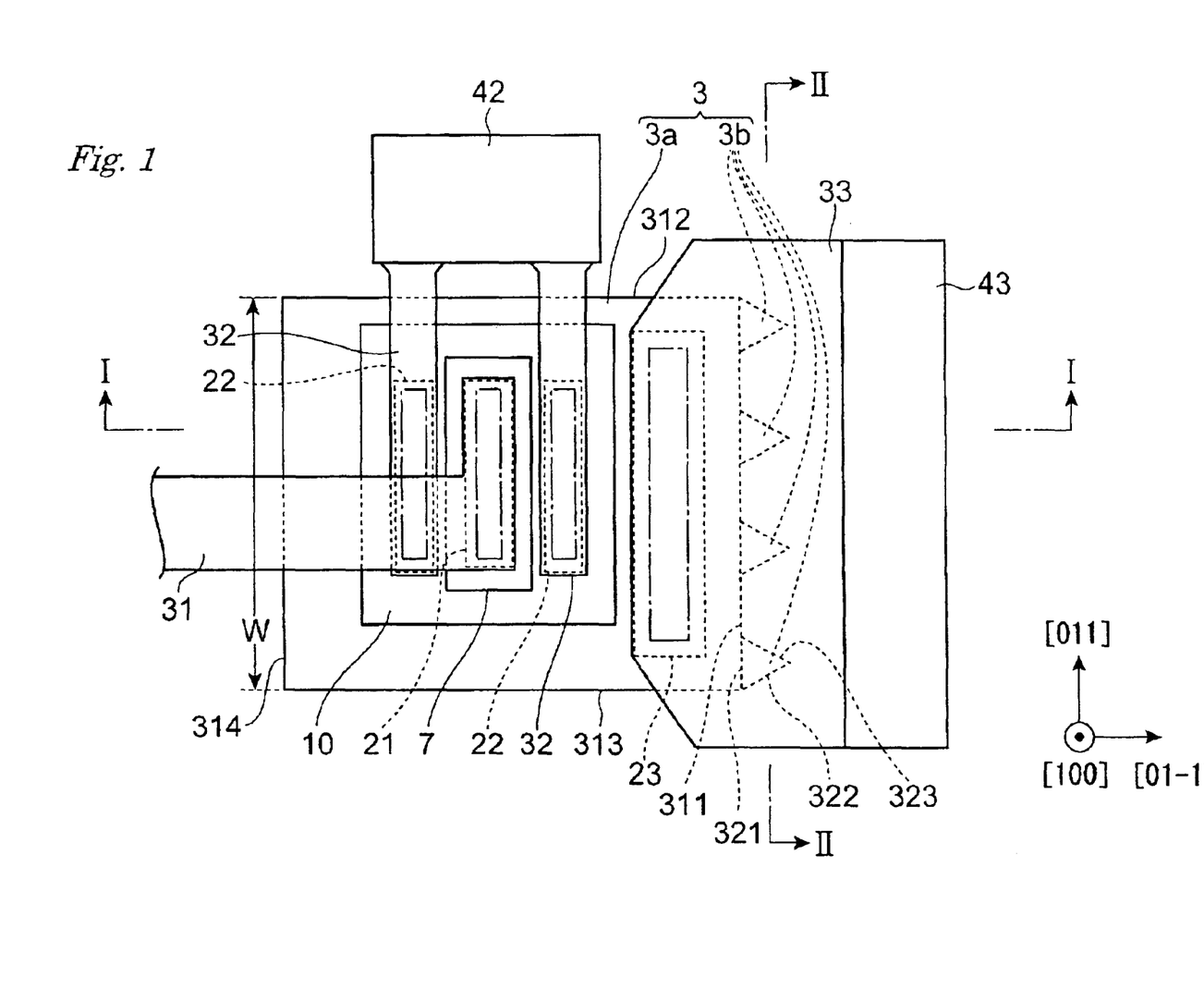
FIG. 1 is a plan view of a HBT of the first embodiment of the present invention.
Figure 2A:
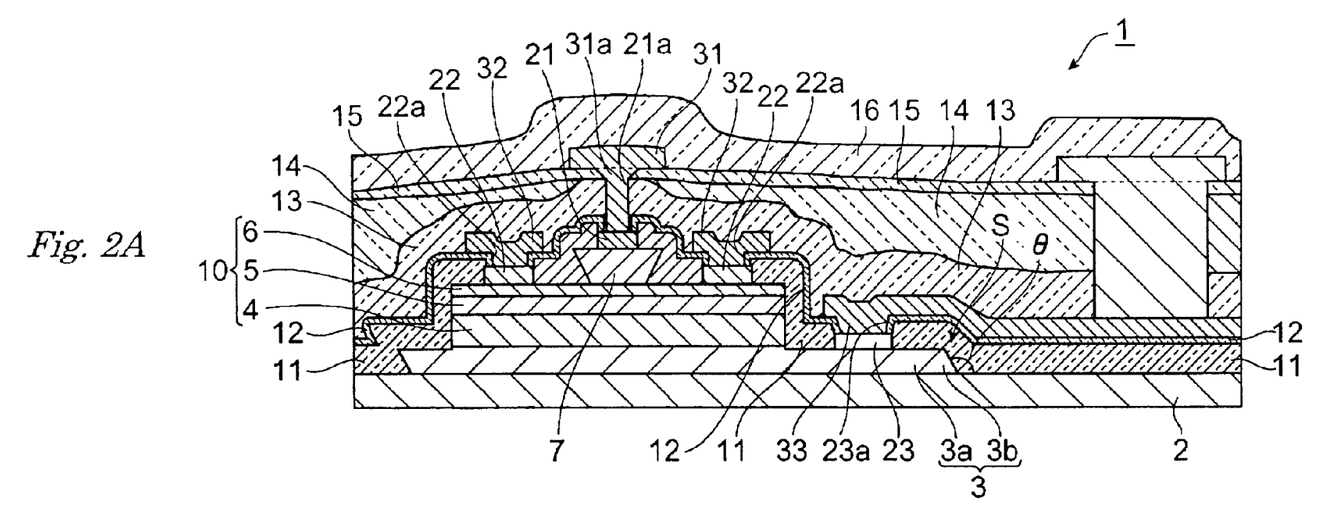
FIG. 2A is a sectional view taken along the line I—I of FIG. 1
Figure 2B:
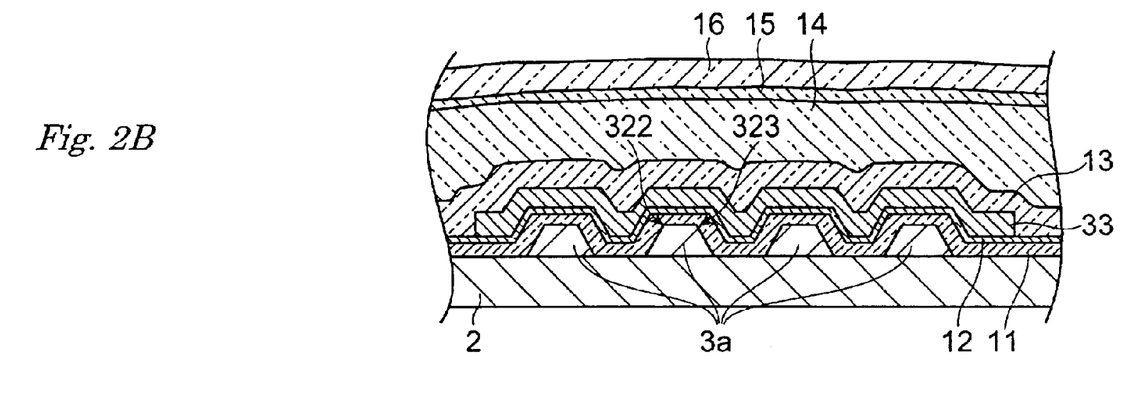
FIG. 2B is a sectional view taken along the line 11—11 of FIG. 1.

Next is a structure of an HBT according to the first embodiment of the present invention. FIG. 1 is a plan view of the HBT of the first embodiment. FIG. 2A is a cross sectional view taken along the line I—I of FIG. 1, while FIG. 2B is that taken along the line II—II in FIG. 1. In FIG. 1, the line I—I is along the [01-1] of the axis, while the line II—II is along the [011] direction.

The HBT 1 comprises: a semi-insulating InP substrate 2, a sub-collector mesa 3 provided on (100) surface of the substrate, a collector mesa 10 provided on the sub-collector mesa, and an emitter contact layer 7 provided on the collector mesa 10. The collector mesa 10 involves a collector layer 4, a base layer 5 and an emitter layer 6.

Table 1 shows materials, thickness, dopant materials, and carrier concentrations of the respective layers in the collector mesa and the emitter contact layer 7. The base layer 5 is doped with carbon (C) as a p-type dopant, while the other layer contain silicon (Si) as an n-type dopant. The emitter layer 6 is made of an InP, and the other layers are made of $In_xGa_{1-x}As$ (hereinafter denoted by InGaAs). The composition x of In is set to be about 0.53, in which the InGaAs nearly matches its lattice constant to InP substrate within ±0.1%.

TABLE 1

| Layer | Material | Thickness (nm) | Dopant | Carrier Concentration ($cm^{-3}$) |
|---|---|---|---|---|
| Emitter Contact 7 | InGaAs | 150 | Si | $1.0 \times 10^{19}$ |
| Emitter 6 | InP | 10 | Si | $4.0 \times 10^{18}$ |
| Base 5 | InGaAs | 40 | C | $3.0 \times 10^{19}$ |
| Collector 4 | InGaAs | 400 | Si | $5.0 \times 10^{18}$ |
| Sub-Collector 3 | InGaAs | 300 | Si | $2.0 \times 10^{19}$ |

As shown in FIG. 1, the collector mesa 10 has a nearly rectangle plane shape with longer sides along the [011] direction and the other sides along the [01-1] direction. The collector mesa 10 is narrower than the sub-collector layer.

The collector mesa 10 contains the collector layer 4, the base layer 5 and the emitter layer sequentially formed in this order.

The sub-collector layer has a first mesa portion 3a with nearly rectangle plane shape and a plural second mesa portions 3b, which form projections protruding from the first mesa portion 3a. The first mesa portion 3a has a pair of sides 311 and 314 along the [01-1] direction and another pair of sides 312 and 313 along the [011] direction. The second mesa portion 3b has a side 321 contacting to the side 311 of the first mesa portion and two sides 322 and 323. The length of the sides 322 and 323 is preferably within a range from 1 um to 3 um. Since the thickness of the sub-collector layer 3 is about 300 nm, as shown in the Table 1, a step S is formed at the edge of the sub-collector layer 3. An angle θ between the substrate and side surfaces of the sides 322 and 323 is greater than 90°. This results that not only the insulating film 11 and 12 but the wiring metal 33 bend in obtuse angle at the step S, thereby avoiding the breaking of the wire.

The width of the wiring metal 33 is greater than a width W of the first mesa portion 3a. Moreover, since the side surfaces along the sides 312 and 313 have a normal trapezoid shape, the metal 33 bends in obtuse angle at the sides 312 and 313. Therefore, the breaking of the wiring metal 32 can be prevented. In the case that the wiring metal 33 is laid only along the direction normal to the side 313, the width of the wiring metal 33 is restricted. On the other hand, the HBT of the present embodiment has a wide wiring metal 33 because the metal 33 can be provided along the direction across the side 311 of the first mesa portion 3a, thus reducing the resistance of the wiring metal and enhancing the range of the wiring layout.

The side surface of the first mesa portion 3a along the side 314 has a reverse trapezoid shape and that along the side 311 and not contacting to the second mesa portion 3b, which is not shown in the figure, also has the reverse trapezoid shape. The wiring metal 33 is provided on the sides with the reverse mesa shape and such wiring metal 33 bends in acute angle at the sides. This results in the breaking of the wiring metal 33. However, even the breaking occurs at the sides with the reverse trapezoid, the second mesa portion 3b prevents the breaking as described above, the electrical connection between the collector electrode and the wiring metal 33 can be secured because the breaking of the wiring can be restricted at the edge of the second mesa portion. This enhances a reliability of the HBT 1.

The HBT 1 has an emitter electrode 21 on the emitter contact layer 7. Since a carrier concentration of the emitter contact layer is about $1 \times 10^{19}$ $cm^{-3}$, an ohmic characteristic between the emitter contact layer 7 and the emitter electrode 21 can be obtained. The HBT 1 also has a base electrode on the emitter layer 6. The thickness of the emitter layer is about 10 nm, which enables that metals of the base electrode reacts with the base layer 5 through the emitter layer 6 by a thermal treatment to realize the ohmic characteristic. The HBT 1 further has a collector electrode 23 on the sub-collector layer 3. Since the carrier concentration of the sub-collector layer is so high as $2 \times 10^{19}$ $cm^{-3}$, the ohmic characteristic can be easily obtained between the collector electrode 23 and the sub-collector layer 3. These electrodes are made of sequential stacked metals of titanium (Ti), platinum (Pt), and gold (Au), and the total thickness of the stacked metals is about 160 nm.

The HBT 1 has insulating films 11 and 12 to isolate the respective electrodes 21 to 23 and to protect the sequentially grown semiconductor layers. The insulating films 11 and 12 are silicon nitride ($Si_3N_4$, hereinafter denoted as SiN) with a thickness of about 250 nm for the film 11, while that of the film 12 is about 100 nm.

Via holes 21a, 22a and 23a are provided in the insulating films 11 and 12 on the respective electrodes 21 to 23. On the emitter electrode 21, a plug 31a made of gold is provided so as to fill the via hole 21a and the wiring metal 31 is placed on the plug 31a. A portion of the wiring metal 31 extends along the [01-1] direction over the base electrode 22.

Another wiring metal 32 is provided on the base electrode 22, which fills the via-hole 22a and electrically contacts to the base electrode 22. The wiring metal 32 extends along the [011] direction. On the collector electrode 23, the wiring metal 33 fills the via-hole 23a and contacts to the collector electrode 23. The wiring metal 33 extends along the [01-1] direction and bends in obtuse angle at the step S as shown in FIG. 2A, thereby escaping from the breaking. These wiring metal 31 to 33 are made of titanium (Ti), platinum (Pt) and gold (Au) stacked in this order.

As described above, the sub-collector layer 3 has the first mesa portion 3a with nearly rectangle plane shape and a plurality of the second mesa portion 3b. The side surfaces formed along the sides 322 and 323 of the second mesa portion has a normal trapezoid and makes an obtuse angle relative to the surface of the substrate. Therefore, the wiring metal 33 provided on the sub-collector layer 3 bends in obtuse angle at the step S, thus escaping from the breaking.

(Second Embodiment)

Figures 3A, 3B:
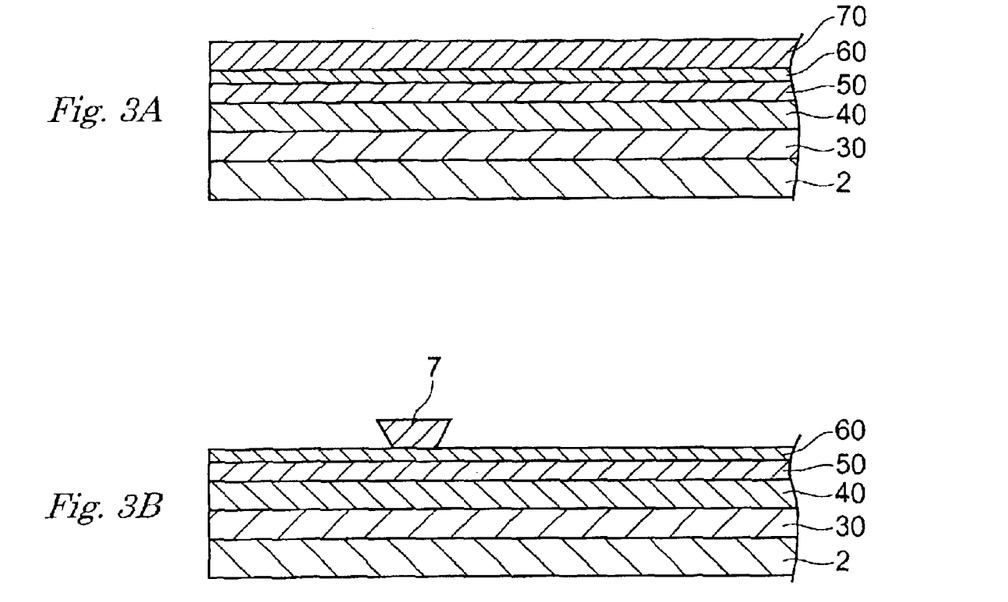
Figure 3C:
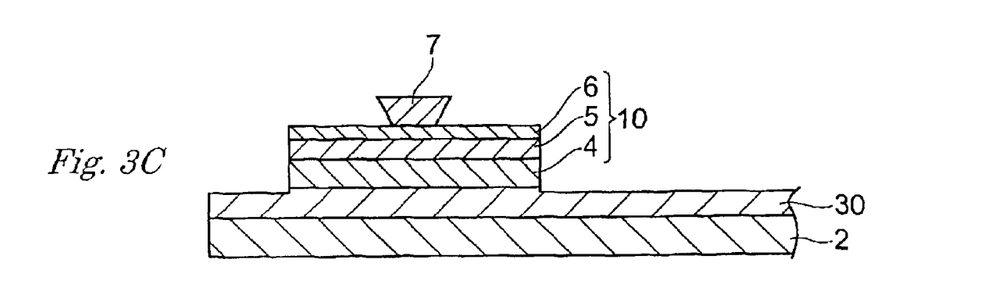

Next, a manufacturing process of the HBT 1 will be described as referring figures from FIG. 3 to FIG. 5. FIGS. from 3A to 3C, 4A to 4C, and 5A to 5C are sectional views of HBT 1 along the [01-1] direction at respective process steps.

Epitaxial Growth

A series of semiconductor films, namely a sub-collector film 30, a collector film 40, a base film 50, an emitter film 60 and an emitter-contact film 70, are epitaxially grown in this order on a (100) surface of a semi-insulating InP substrate. An Organo Metallic Chemical Vapor Deposition (OMVPE) technique is used for the epitaxial growth. In the growth, source materials for the group III elements is Triethyl Gallium (TEGa) and Trimethyl Indium (TMIn), while those for the group V elements is Arsine ($AsH_3$) and Phosphine ($PH_3$). Another source materials is Silane ($SiH_4$) for n-type dopant, while Diethyl Zinc (DEZn) or Carbon Bromide ($CBr_4$) is used for p-type dopant.

The respective semiconductor films with predetermined compositions and carrier concentrations can be obtained by mixing and supplying these source materials to the OMVPE equipment. The growth temperature is preferably from 600° to 750° C. from the viewpoint of the quality. The sub-collector film 30 will be formed to the sub-collector layer 3 by the subsequent process step and other films 40 to 70 will be similarly converted to corresponding layers 4 to 7 in FIG. 2.

Emitter Contact Layer Forming

The following process will form the emitter contact layer 7. A photoresist with a predetermined rectangular pattern is formed on the emitter contact film 70. The rectangle of the photo resist has longer sides extending along the [011] direction and shorter sides extending along the [01-1] direction. Subsequently to the photoresist formation, a portion of the emitter contact film 70 not covered by the resist is etched by a mixed solution of a phosphoric acid, a hydrogen peroxide and a water. This mixed solution shows a selective function, that is, the mixing can etch the emitter contact film 70 made of InGaAs but is hard to etch the emitter film 60 made of InP. Therefore, the etching substantially stops after the exposure of the emitter film 60. The emitter contact layer 7, the cross section of which shows the reverse trapezoid as shown in FIG. 3B, is formed.

The Collector Mesa Formation

The collector mesa is formed by the following process. The another photoresist, the pattern of which entirely covers the emitter contact layer 7, is formed on the emitter film 60. The resist has a rectangular shape with a pair of sides extending along the [011] direction. Subsequently to the resist formation, two step etching is performed. First, a portion of the emitter film 60 not covered by the photoresist is removed by a solution of hydrochloric acid and water. This solution shows a selective etching characteristic, that is, the solution can etch only the emitter film 60 made of InP but is hard to etch the base film 50 made of InGaAs. Therefore, the etching substantially stops after the exposure of the base film 60. At this step, the emitter layer 6 is formed.

Next, another solution of sulfuric acid, hydrogen peroxide and water performs the etching of the base film 50 and the collector film 40. It is preferable to etch an upper portion of the sub-collector film 30 by about 100 nm. This over-etching to the sub-collector film 30 reliably removes the collector film 40, thus forming the collector mesa 10 that contains the emitter layer 6, the base layer 5, and the collector layer 4 as shown in FIG. 3C. The one side of the collector mesa 10 extends along the [011] direction.

Sub-Collector Layer Formation

Figure 4A:
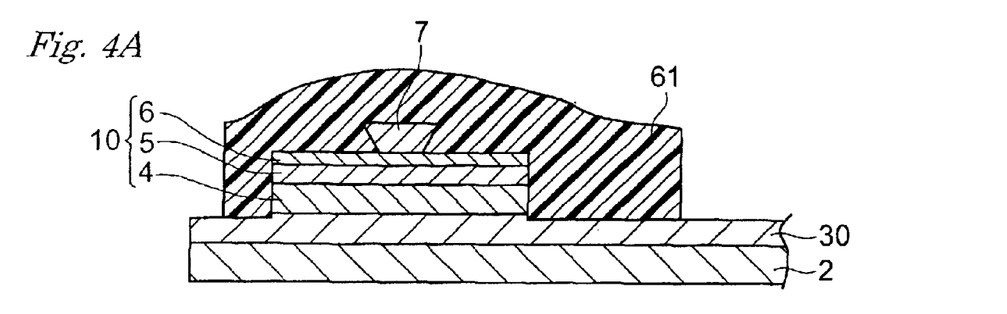
Figure 5A:
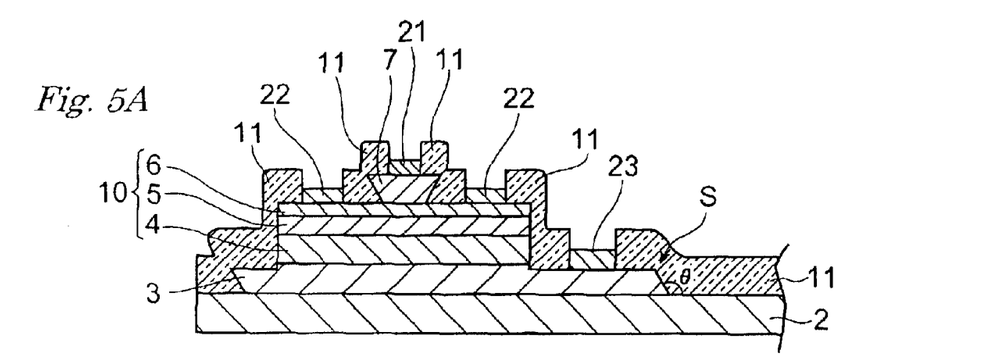
Figure 5B:
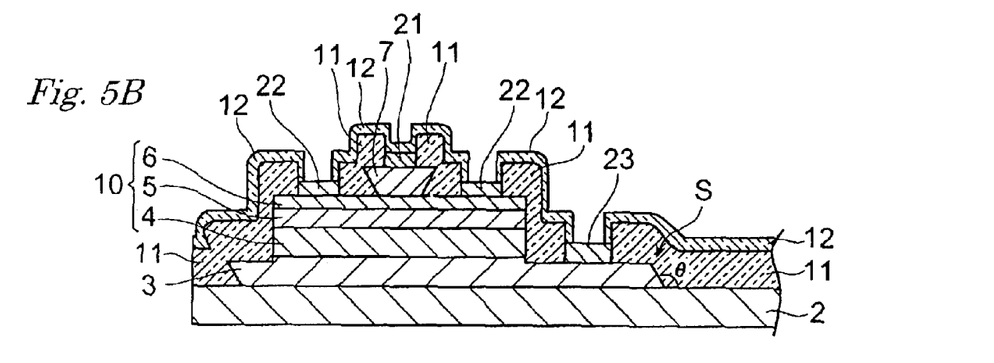
Figure 7A:
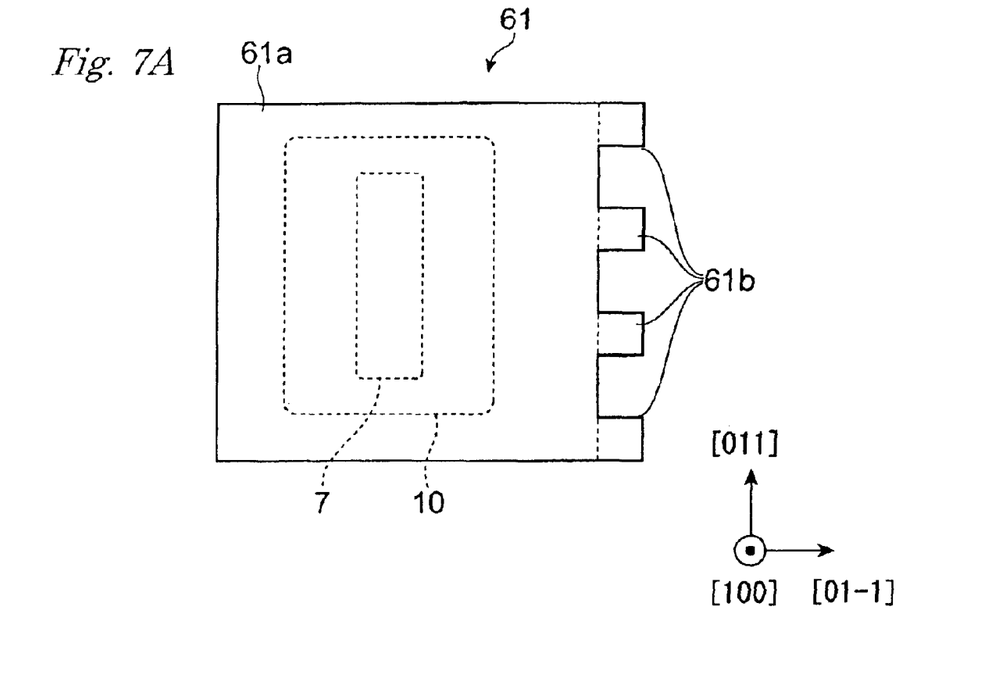
FIG. 7A is a plan view showing a mask for using as an etching mask to form the sub-collector layer.

A mask 61 made of photoresist, which covers the collector mesa 10, is formed on the sub-collector film 30 as shown in FIG. 4A. The plane figure of the mask will be explained in detail as referring to FIG. 7A. FIG. 7A shows a plan view of the mask 61, which covers the emitter contact layer 7 and the collector mesa 10. The mask contains a first portion 61a of nearly rectangle and a plurality of second portion 61b. A pair of sides of the first portion 61a extends along the [011] direction. The second portions 61b contact to one side of the first portion, which extends along the [011] direction. Although FIG. 7A illustrates four pieces of the second portions 61b, the present invention is not restricted to the figure.

The sub-collector film 30 is etched by a solution of a phosphoric acid, a hydrogen peroxide and water. Because this solution has a selective etching characteristic for InP and the etching substantially stops at the exposure of the InP substrate, the height of the step is nearly identical with the thickness of the sub-collector film.

Figure 7B:
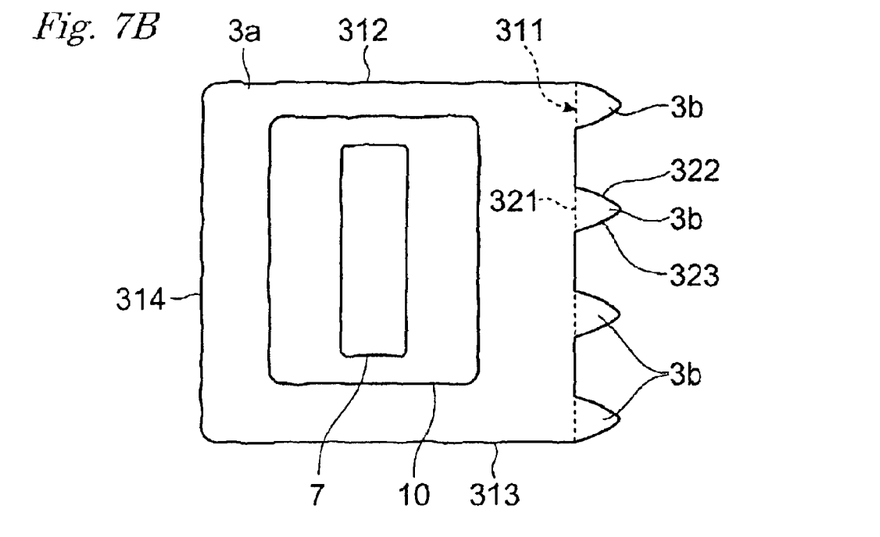
FIG. 7B shows a plan view of the sub-collector layer after the etching.

Further, the etchant has a function to accelerate the etching along the specific direction of InGaAs, that is, the etching rate along the [0-10] and [00-1] direction is greater than that along the other direction. Therefore, the plane shape of the sub-collector layer 3 after the etching does not reflect the shape of the etching mask 61 and finally becomes that shown in FIG. 7B. The sub-collector layer contains the first mesa portion 3a and a plurality of the second mesa portion 3b. The second mesa portion has a side 321 contacting to one side 311 of the first mesa portion 3a and two curved sides 322 and 323. The side surfaces accompanying to the respective sides 322 and 323 have an obtuse angle to the substrate 2.

Figure 4B:
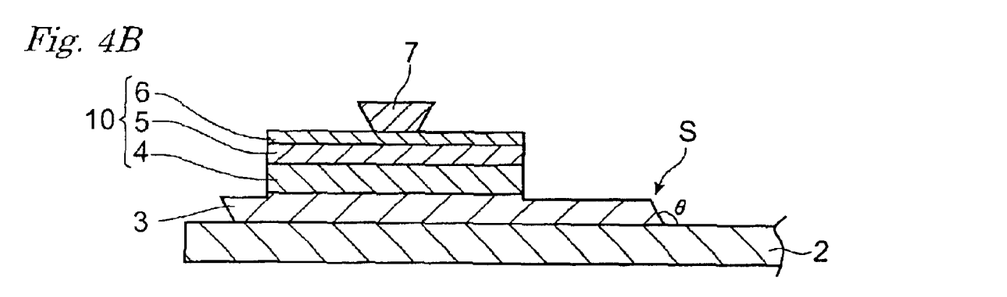

The process thus described forms the sub-collector layer 3 with the step S in the edges formed as shown in FIG. 4B. The substrate 2 is exposed in the peripheral of the sub-collector layer 3, which electrically isolates HBT 1 from other electronic devices integrally formed on the substrate.

Electrode Formation

An insulating film 11 made of SiN by a chemical vapor deposition (CVD) technique with a thickness of about 250 nm is formed on the entire surface of the substrate. The resist mask 62 is formed on the insulating film 11. The mask has rectangular openings on the emitter contact layer 7, the emitter layer 6 and the sub-collector layer 3. The reactive ion etching (RIE) technique removes portions of the insulating film 11 exposed within the openings.

Figure 4C:
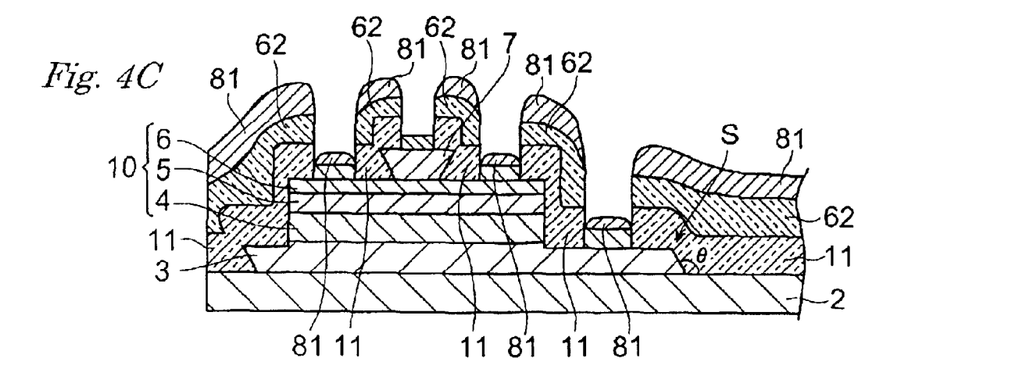

As shown in FIG. 4C, metal films of Ti, Pt and Au are sequentially deposited without removing the photo resist. The thickness of Au is 100 nm and those of other two metals are 20 nm. After stripping the photoresist with metals deposited thereon and performing the thermal treatment of one minutes at 400° C., the emitter electrode 21, the base electrode 22, and the collector electrode 23 are completed.

Wiring Metal Formation 1

Next, the formation of the wiring metal 32 and 33 will be described. The wiring metal 32 is for the base electrode 22, while the metal 33 is for the collector electrode, respectively. Another insulating film 12 made of SiN with a thickness of about 100 nm are deposited on the entire surface of the substrate, which covers the respective electrodes 22 and 23. A photoresist with openings on the base electrode 22 and the collector electrode 23 is formed on the insulating film 12. The RIE etching based on the photoresist makes a via-hole 22a on the base electrode 22 and another via-hole 23a on the collector electrode.

Figure 8A:
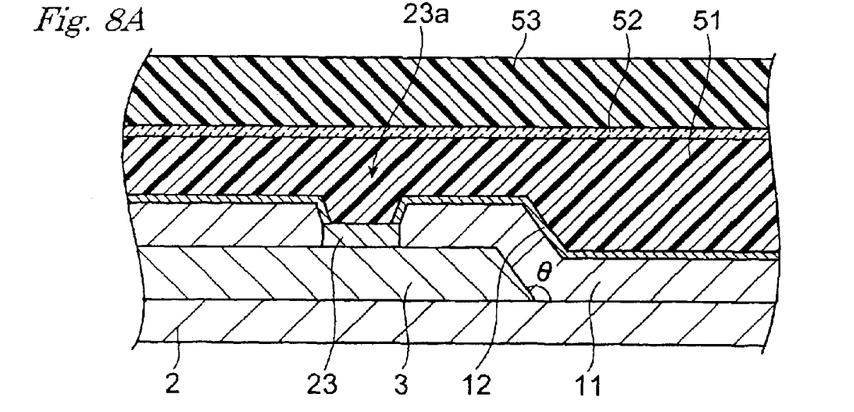
Figure 8B:
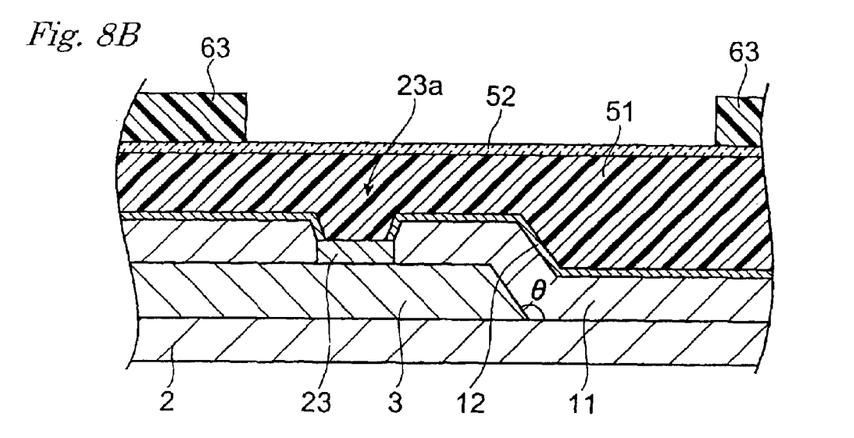
Figure 8C:
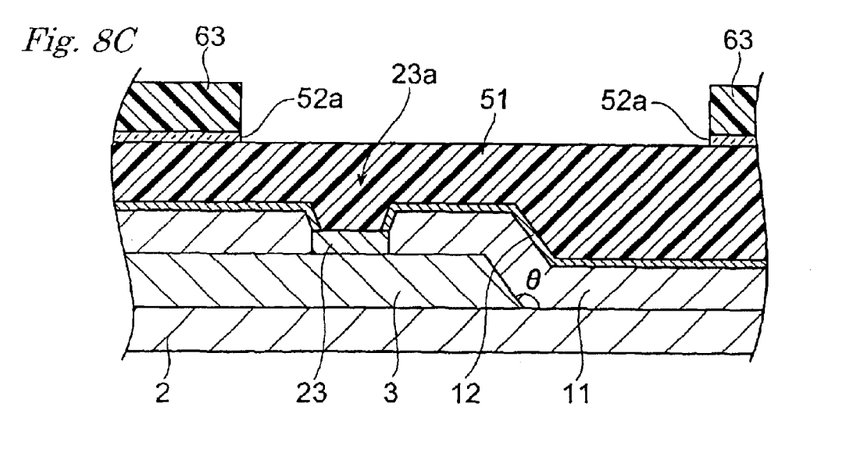
Figure 9A:
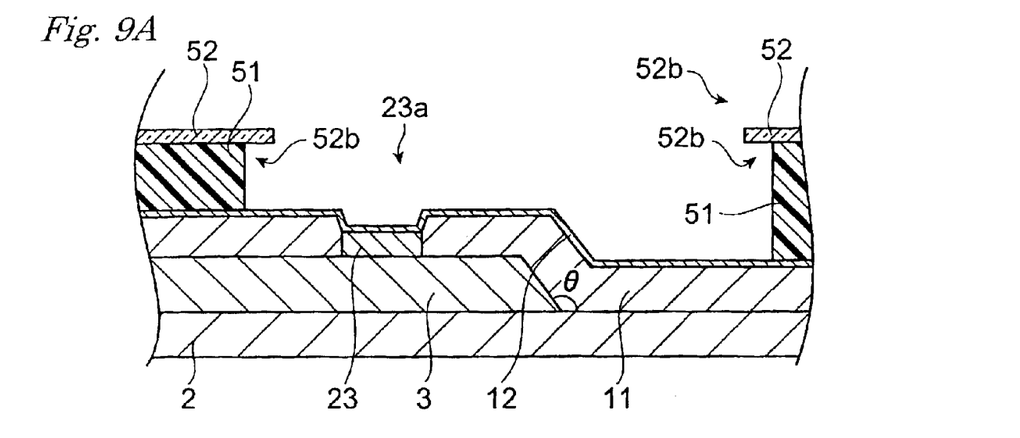

Next will describe the process of forming the wiring metal 32 and 33 as referring to figures FIGS. 8A to 8C and FIGS. 9A to 9C. These figures show the collector electrode and its surrounding for the sake of explanation. A first photoresist, a SiO$_2$ film, and a second photoresist are sequentially formed on the substrate 2 as illustrated in FIG. 8A. The thickness of the first resist 51 is about 1.3 µm and that of the SiO$_2$ film 52 is about 0.3 µm. The second resist 53 is patterned so as to reflect the pattern of the wiring metal 33. The RIE etching using CF$_4$ as reactive gas removes the SiO$_2$ film exposed within the opening of the second photoresist and subsequent RIE etching using O$_2$ etches the first photoresist 51 exposed at the opening 52a of the SiO$_2$ film. Since the second photoresist is etched to the direction parallel to the surface of the substrate by the RIE, the SiO$_2$ film forms an overhang as shown in FIG. 9A. The second resist on the SiO$_2$ film is removed simultaneously with the etching of the first resist.

Figure 9B:
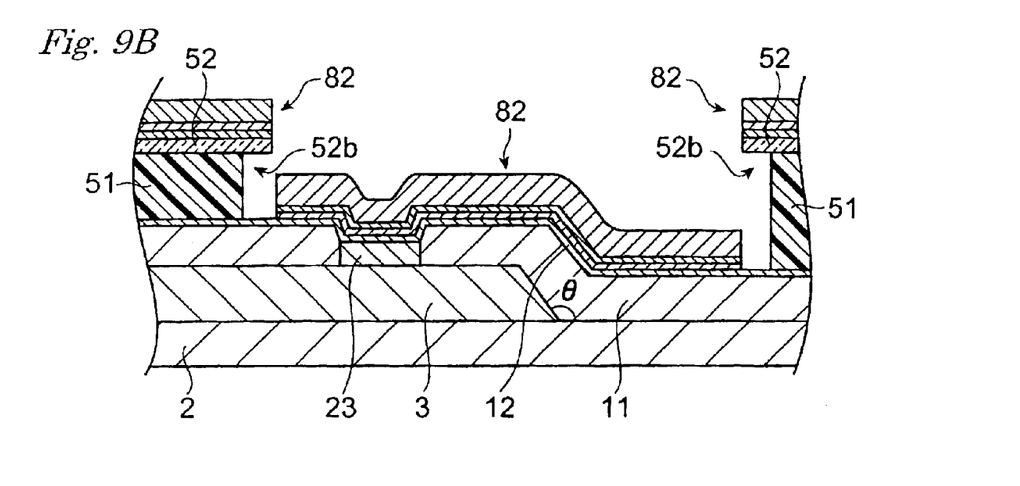
Figure 9C:
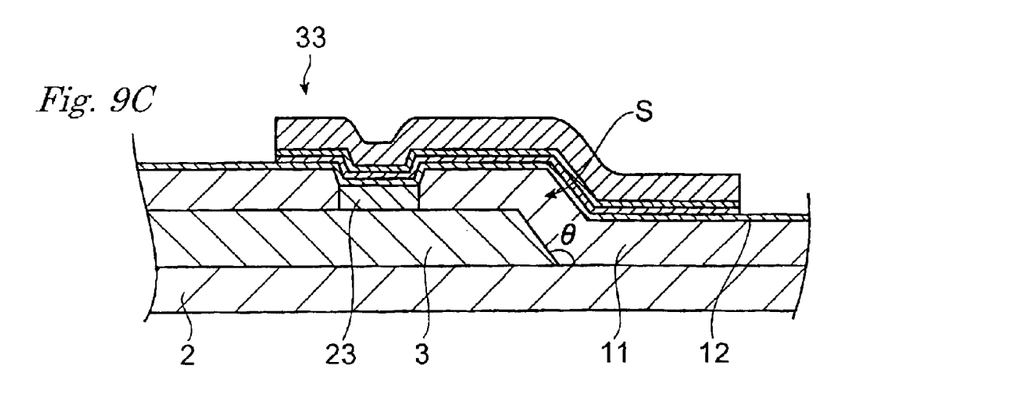

After the RIE etching, a series of metals 82 of Ti, Pt and Au is evaporated in this order. The thickness of Ti, Pt and Au are about 30 nm, 50 nm and 450 nm, respectively. As illustrated in FIG. 9B, the metals 82 are divided into two portions by the overhang of the SiO$_2$ film, namely a portion within in the opening of the SiO$_2$ film and another portion on the SiO$_2$ film. Therefore, removing the first resist by a solvent, the metals on the SiO$_2$ film are removed simultaneously and only the metals deposited within the opening of the SiO$_2$ film 52 are left so as to form the wiring metal 33 as shown in FIG. 9C. This process for forming the wiring metal does not require an etching of the metals 82. In the series of metals, Ti enhances the adhesiveness to the electrode 23, Pt functions as a barrier layer and Au provides a substantial conductive layer.

The wiring metal 33 covers the edges of the sub-collector layer 3, where the step S is formed with a height of about 300 nm. The side surface of the step S slants by the angle θ that is greater than 90° to the surface of the substrate. Therefore, even the wiring metal 33 cross over the step S, the metal does not bend in acute angle, which results in the enhancement of the reliability.

Figure 5C:
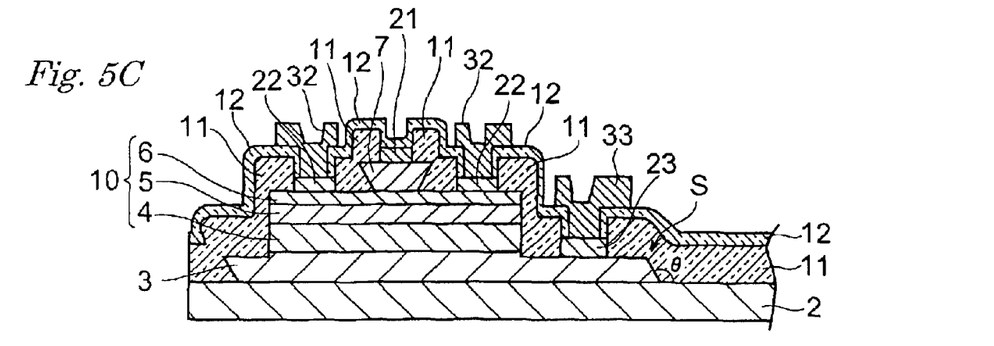

The above mentioned process for the wiring metal formation can be applied to the wiring metal 32 that contacts to the base electrode 22 as shown in FIG. 5C.

Wiring Metal Formation 2

Figure 6A:
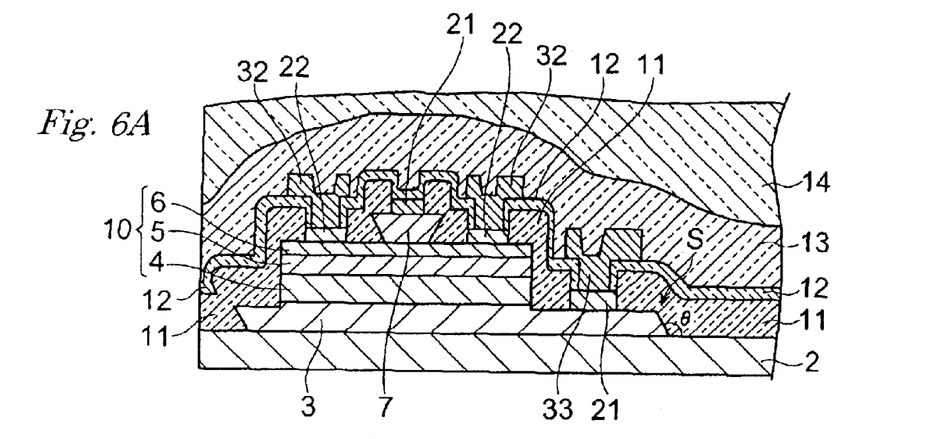
Figure 6B:
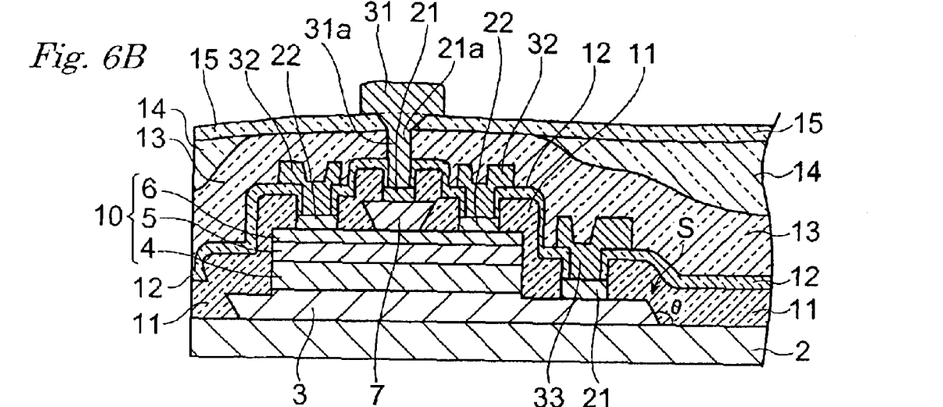
Figure 6C:
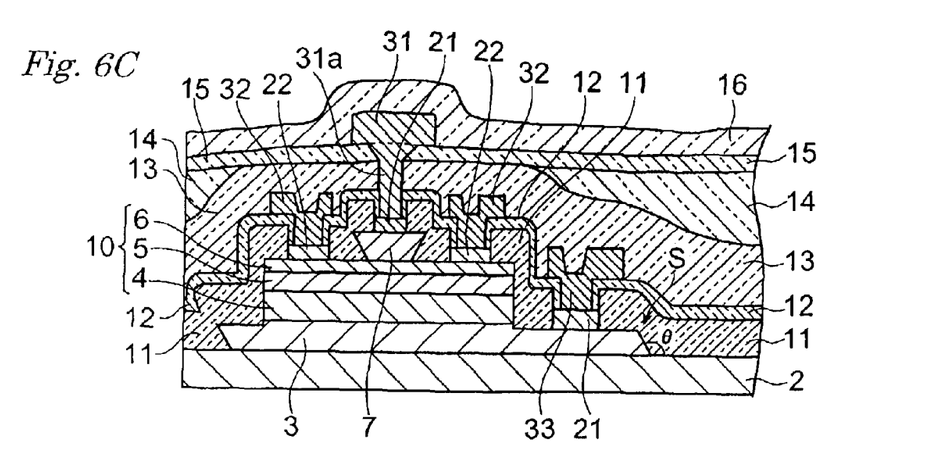

Next, the process for the wiring metal 31 will be described as referring to figures FIGS. 6A to 6C. A SiN film 13 with a thickness of 850 nm and a Spin-On-Glass (SOG) film 14 are sequentially deposited on the substrate. The thickness of the SOG film is about 100 nm at the emitter electrode, while that is about 500 nm at regions where the sub-collector mesa is not formed. After the deposition of two films 13 and 14, the RIE performs flatting of two films. The amount of etching depth is set so as to remove completely the SOG film at the emitter electrode 21. Further, the condition of the RIE is determined so as to accelerate the etching of the SiN film as compared to the SOG film, thereby prompting the flatting of two films 13 after the appearance of the SiN film.

After the flatting, another insulating film 15 is deposited onto the SOG film 14 and the SiN film 13. The RIE forms a via-hole 21a on the emitter electrode 21 by a photo resist with an opening corresponding to the via-hole 21a as an etching mask. Subsequently to the RIE, a gold plug 31a is buried within the via-hole 21a after the evaporation of gold and the removing of the photoresist. The similar process as the formation of the wiring metal 32 and 33, which is illustrated in FIG. 8 and FIG. 9, forms the wiring metal 31 as shown in FIG. 6B. Finally, a SiN film 16 is formed so as to cover and to protect the wiring metal 31, thus completing the HBT 1.

(Third Embodiment)

Next, another manufacturing process will be described according to the third embodiment of the present invention. The third embodiment is the same process as the second embodiment except for the shape of the etching mask for the sub-collector layer.

Figure 10A:
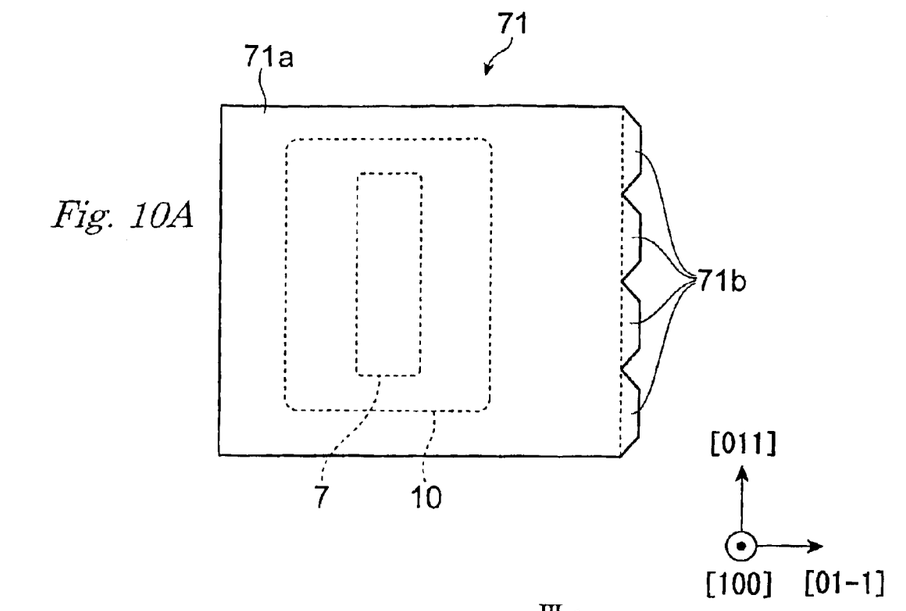
FIG. 10A is a plane view of a mask for using as an etching mask of the third embodiment.

The substrate 2, on which the collector mesa 10 and the emitter contact layer 7 are formed, is obtained after growing epitaxially respective layers and etching those grown layers twice. Subsequently, a photoresist 71 with a predetermined pattern is formed on the substrate. The detail of the resist pattern 71 will be described as referring to FIG. 10. FIG. 10A shows a plan view of the resist pattern 71, while FIG. 10B shows a plane shape of the sub-collector layer after the etching by the resist 71 as the etching mask.

The photoresist 71 has a first rectangular portion 71a and a plurality of second portions 71b. A pair of one sides of the first portion 71a extends along the direction [011] and the other pair of sides extends along the [01-1] direction. The second portion is a trapezoid with one side, which is parallel to and longer than the other side, contacts to the side along the [011] direction of the first portion 71a. Moreover, the photoresist 71 has four of the second portion with adjoining to each other.

The solution of the phosphoric acid, the hydrogen peroxide and water etches the sub-collector film 30 with the photo resist 71 as the etching mask. The etching performs not only the direction normal to the surface of the sub-collector film but parallel to the surface, especially the [0-10] direction and the [00-1] direction of the orientation. Therefore, the final plane shape of the sub-collector layer is such configuration as shown in FIG. 10B. Namely, the sub-collector layer has a first mesa portion 3a with nearly rectangle and a plurality of a third mesa portion 3m with nearly triangle. The third mesa portion 3m is a projection protruding from the first mesa portion 3a and one side of the third mesa portion 3m comes into contact with the side 311 of the first mesa portion 3a.

Figure 10B:
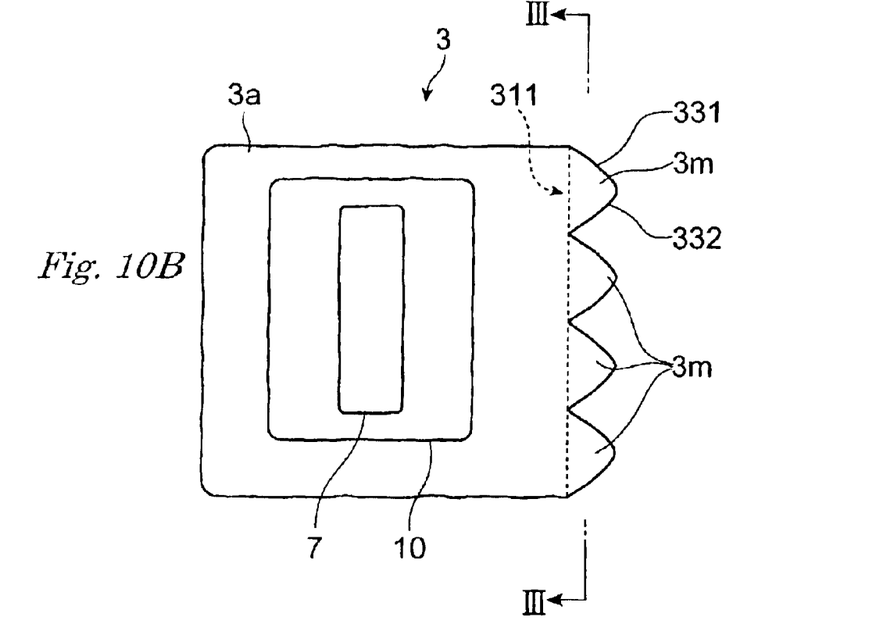
FIG. 10B is a plan view of the sub-collector layer after the etching.
Figure 11:
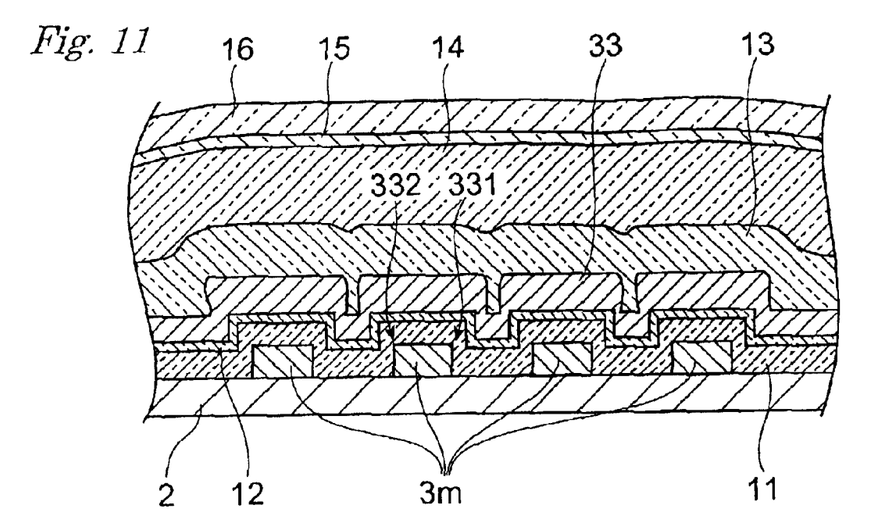
FIG. 11 shows a cross sectional view taken along the line III—III of FIG. 10B.

FIG. 11 shows cross sectional diagram along the line III—III in FIG. 10B. As shown in FIG. 11, the side surface corresponding to the sides 311 and 312 of the third mesa portion 3m, respectively, is nearly normal to the surface of the substrate 2 and equivalent to the (001) surface. The wiring metal providing over such side surface can be prevented from breaking as compared with the wiring over the surface formed into a reverse trapezoid, thus enhancing the reliability of the wiring metal.

The sub-collector layer 3 is formed thus described process, and subsequently the same procedure as the second embodiment are performed for the electrode formation and the wiring metal formation, whereby completing the HBT 1.

From the invention thus described, the invention and its application may be varied in many ways. The thickness of the respective layers shown in Table 1 are illustrative and may be arranged based on the specification of the HBT. Especially, the emitter layer 6 is preferably replaced to GaInAsP or InAlAs and the other layers are left to InGaAs. Since GaInAsP and InAlAs has a greater band gap energy than that of InGaAs, such combination results in the preferable HBT. The dimension of the photoresist 61 and 71 is adjustable depending on the thickness of the sub-collector layer 3. Moreover, SiN or $SiO_2$ is applicable for the etching mask 61 and 71 replacing the photoresist.

Although the collector layer 4, the base layer 5 and the emitter layer 6, which form the collector mesa 10, have substantially same plane shape as illustrated in FIG. 2A, the invention is not restricted to this configuration. The combination, in which the base layer and the collector layer have substantially same rectangular shape, while the emitter layer has smaller size compared to the base and the collector layer, is also preferable. In this configuration, the base electrode is formed directly onto the base layer.

Such variations are not to be regarded as a departure from the spirit and scope of the invention, and all such modifications as would be obvious to one skilled in the art are intended for inclusion within the scope of the following claims.

What is claimed is:

1. A hetero-bipolar transistor having a collector layer, a base layer made of a first III-V semiconductor material with a first band gap energy and an emitter layer made of a second III-V semiconductor material with a second band gap energy greater than the first band gap energy, the hetero-bipolar transistor comprising:
    a semiconductor substrate having a primary surface;
    a sub-collector layer having a first portion and a plurality of second portions, the first portion being substantially rectangular with one side extending along the [011] direction, the plurality of second portions being in contact with the one side of the first portion;
    a collector electrode on the sub-collector layer; and
    a wiring metal electrically contacting to the collector electrode, the wiring metal traversing at least one of four sides of the first portion and at least one of the plurality of the second portions.

2. The hetero-bipolar transistor according to claim 1, wherein the one side of the first portion contains a surface having an acute angle relative to the primary surface of the substrate.

3. The hetero-bipolar transistor according to claim 1, wherein the respective second portions of the sub-collector layer include a plurality of surfaces, at least one of the plurality of the second portion surfaces having an obtuse angle relative to the primary surface of the substrate.

4. The hetero-bipolar transistor according to claim 3, wherein, at least one surface of the second portion is a (001) surface.

5. The hetero-bipolar transistor according to claim 1, wherein the substrate is made of InP; the sub-collector layer, the collector layer, and the base layer are made of InGaAs lattice matched to the substrate; and the emitter layer is made of InP.

6. The hetero-bipolar transistor according to claim 1, wherein the substrate is made of InP; the sub-collector layer, the collector layer, and the base layer are made of InGaAs lattice matched to the substrate; and the emitter layer is made of InAlAs or InGaAsP, wherein the InAlAs and the InGaAsP are lattice matched to the substrate.

* * * * *